United States Patent
Singh et al.

(10) Patent No.: US 10,805,123 B2
(45) Date of Patent: Oct. 13, 2020

(54) CROSSTALK GENERATION AND DETECTION FOR DIGITAL ISOLATORS

(71) Applicant: Texas Instruments Incorporated, Dallas, TX (US)

(72) Inventors: Atul Singh, Bangalore (IN); Kumar Anurag Shrivastava, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 135 days.

(21) Appl. No.: 15/914,753

(22) Filed: Mar. 7, 2018

(65) Prior Publication Data
US 2019/0278245 A1 Sep. 12, 2019

(51) Int. Cl.
| | |
|---|---|
| H04L 25/02 | (2006.01) |
| G01R 31/317 | (2006.01) |
| H03D 3/00 | (2006.01) |
| G06F 1/08 | (2006.01) |

(52) U.S. Cl.
CPC ........ *H04L 25/0268* (2013.01); *G01R 31/317* (2013.01); *G01R 31/31727* (2013.01); *H03D 3/00* (2013.01); *H04L 25/0266* (2013.01); *G01R 31/31708* (2013.01); *G05B 2219/25462* (2013.01); *G06F 1/08* (2013.01)

(58) Field of Classification Search
CPC ........ G01R 31/31708; G01R 31/31727; G01R 31/317; G01R 29/02; G05B 19/0423; G05B 2219/25462; G06F 1/08; H04L 1/0036; H04L 25/0268; H04L 25/0266; H04L 25/08; H04L 25/49; H03D 3/00
See application file for complete search history.

(56) References Cited

U.S. PATENT DOCUMENTS

| | | | |
|---|---|---|---|
| 7,468,547 B2 | 12/2008 | Harvey | |
| 7,899,968 B2 | 3/2011 | Bliss et al. | |
| 9,941,999 B1* | 4/2018 | Milesi | H04L 1/0036 |
| 2013/0264961 A1* | 10/2013 | Chang | H04B 1/48 315/201 |
| 2014/0169038 A1* | 6/2014 | Kamath | H03D 3/00 363/16 |
| 2014/0204619 A1* | 7/2014 | Telefus | H02M 3/33523 363/21.01 |

\* cited by examiner

*Primary Examiner* — Que Tan Le
*Assistant Examiner* — Jennifer D Bennett
(74) *Attorney, Agent, or Firm* — Ronald O. Neerings; Charles A. Brill; Frank D. Cimino

(57) ABSTRACT

A method of detecting crosstalk for a digital isolator having first and second channels including two die with channels including a transmit side, receive side, with ≥1 die including a capacitive barrier for each channel. A first clock signal at a first frequency in a first pulse pattern and a second clock signal at a second frequency in a second pulse pattern are configured, wherein the pulse patterns have a phase difference. The transmit side of the channels each encode their received clock pulse pattern, then modulate with a carrier frequency to provide a fc1 and a fc2 signal, respectively. The receive side of the channels demodulate received signals during a rising or falling edge of their clock signal to generate a delayed received version of the first and second clock pulse pattern. Missing pulses are identified by comparing the delayed received clock pulse patterns to their clock pulse patterns.

28 Claims, 5 Drawing Sheets

CROSSTALK GENERATION AND DETECTION FOR DIGITAL ISOLATORS

FIELD

This Disclosure relates to the testing of multi-channel digital isolators.

BACKGROUND

Circuit isolation can be important where common mode noise may be a problem, where high-speed data transmission may be subject to interference due to magnetic fields, or where the ground reference between two different devices may not be compatible for a given circuit application, such as for motor control. Digital isolators overcome many of the deficiencies of optical isolators, and are designed to galvanically isolate systems. One arrangement comprises a receiver chip and a separate transmitter chip which together provide at least one communication channel, where the die are coupled together by a bond wire and at least one die includes a high voltage isolation (ISO) capacitor connected in the channel path in series (e.g., such as on the receiver chip). This arrangement enables modulated data signals generated on the transmitter chip to be passed to the receiver chip, but blocks high voltage (e.g., 500 or 1,000 volts) applied to the active circuitry on one die (e.g., the receiver die) in its application from reaching the active circuitry on the other die (e.g., the transmitter die).

One multi-chip digital isolator design is capacitively coupled by having a logic input and output buffer separated by an ISO capacitor comprising a thick silicon oxide dielectric which provides a capacitive-isolation barrier. Other known digital isolators include RF-coupled digital isolators that combine high speed complementary metal-oxide-semiconductor (CMOS) and air-core or magnetic-core transformer (using inductors) technology to support high data speeds and low power.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes channel crosstalk detection testing for digital isolators can be improved if implemented on Automated Test Equipment (ATE), particularly the device throughput. However, no prior channel crosstalk detection solution is believed to exist on an ATE. Known bench testing for digital isolated generally uses a bench setup comprising a function generator having a programmed phase shift between a first clock and a second clock, where the phase shift is varied across voltage and temperature corners. However, this known bench test arrangement is time consuming for all the possible phase combinations that need to be covered, and it is thus recognized herein to not be reasonable to implement such bench testing in a semiconductor test production environment.

This Disclosure also recognizes that there can be crosstalk between the adjacent channels of a multi-channel digital isolator because of the respective periodic waveforms (e.g., sinusoid) frequencies generated in the transmit side circuitry from received pulse input data interact with each other, where the channel 1 (Ch1) modulated periodic-waveform at a first carrier frequency (e.g., at about 2 GHz) is referred to herein as a fc1 signal and the channel 2 modulated periodic waveform at the second carrier frequency (e.g., at about 2 GHz) is referred to herein as a fc2 signal. Crosstalk of the modulated periodic waveforms between channels for a given digital isolator device can be capacitive between channels die-to-die, such as the transmit side circuitry for channel 1 of one die to the receive side circuitry for channel 2 of another die or be inductive across the channels of the same die from the transmit side circuitry of one channel to the receiver side circuitry of another channel, where inductors may be added for tuning out parasitic capacitance.

Disclosed aspects include a method of detecting channel crosstalk for a multi-channel digital isolator having first and at least a second channel including a first and second die coupled by a bond wire, with each channel including a transmit side including transmitter and a receive side including a receiver. For each channel at least one of the die includes a capacitive barrier (i.e., an ISO cap). A first clock signal at a first frequency (F1) in a first clock pulse pattern and a second clock signal at a second frequency (F2) in a second clock pulse pattern are configured (typically provided by an ATE), wherein the clock pulses in the respective clock pulse patterns have a phase difference.

The transmit side of the channels each encode their received clock pulse pattern, then modulate with a carrier frequency to provide a fc1 and a fc2 signal, respectively. The receiver on the receive side of the channels demodulate the fc1 and fc2 signals transmitted by the transmitter received during rising or falling edges of their clock signal (F1, F2) to generate a output pulse pattern which is the input pulse pattern received after being delayed by the propagation delay of the input clock pulse pattern. Missing pulses are identified by comparing the delayed received clock pulse pattern to their respective input clock pulse pattern, where delayed received clock pulse patterns will have at least one missing clock pulse if there is significant attenuation of fc1 or fc2 sufficient to result in failure of the receiver to detect at least one missing pulse.

BRIEF DESCRIPTION OF THE DRAWINGS

Reference will now be made to the accompanying drawings, which are not necessarily drawn to scale, wherein:

FIG. 4A has no missing clock pulses shown, so the crosstalk test is passed.

DETAILED DESCRIPTION

Figure 1A:
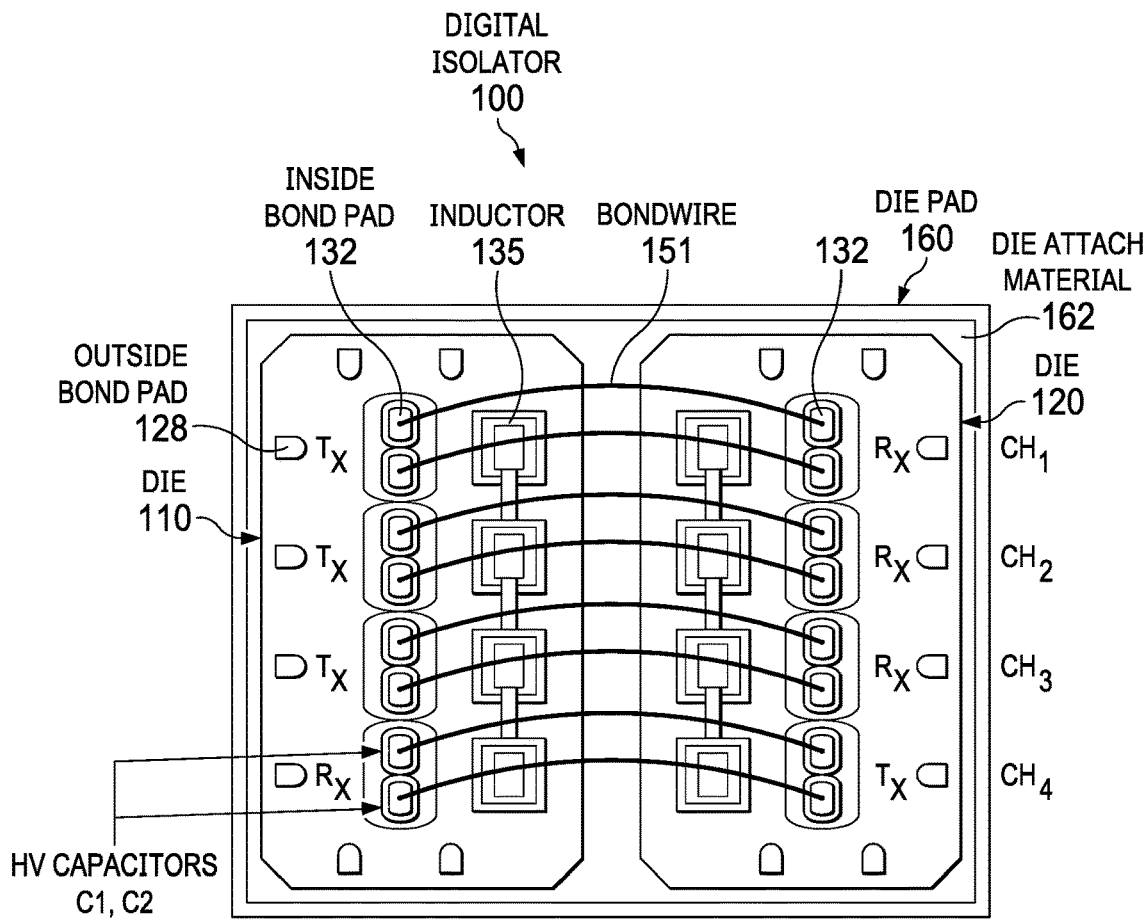
FIG. 1A shows an example 4 channel digital isolator with capacitive barriers for each channel 1 to 4 on both the transmit side with transmit circuitry shown as Tx and the receive side with receive circuitry shown as Rx, which demonstrates that the transmit and receive side circuitry involved in channel crosstalk can be on the same die or on different die.

Example aspects in this disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed ATE-based crosstalk detection solutions can test the respective channels of a digital isolator generally in final production test by utilizing existing ATE resources with a new test pattern generation that can be implemented without adding any external circuitry to the ATE. Disclosed crosstalk pattern generation for the input channels of the digital isolator comprises using clock pulse patterns derived from two ATE clocks (e.g., a main synchronous clock and a free running (non-synchronous) DUT clock, see the main clock 306 and DUT clock 308 shown in the ATE 300 in FIG. 3 described below) operating at different clock frequencies (F1 and F2). The phase shift (phase difference) between the edges of the adjacent channels is within a predetermined limit (e.g., 100 psec) when run for a large number of F1 and F2 duty cycles, such as at least 100,000 duty cycles. For example, when F1 and F2 are both about 2 MHz, such as a 500 ns pulse period and a 503,545 nsec pulse period, are run for 600,000 duty cycles thus being for ~300 msec, 5 psec can be the resulting minimum phase shift between F1 and F2.

Disclosed pattern generation can thus test for the worst case for crosstalk occurrence because essentially all possible phase shift combinations between fc1 and fc2 can be covered including the worst case 180° phase shift. Detection of crosstalk occurrence can comprise strobing for missing clock pulse(s) of the output clock pulse pattern generated by the receiver using the ATE. (See FIG. 4A and FIG. 4B described below). Optionally the strobing is performed by running the test pattern twice to take care of forward and reverse channels of the digital isolator because forward and reverse channel receiver outputs cannot generally be strobed at the same time, so the pattern can be run twice in cases that there are both forward and reverse channels (such as shown in the digital isolator 100 in FIG. 1A described below).

FIG. 1A shows an example 4 channel digital isolator 100 with capacitive barriers (ISO caps) shown as capacitors C1, C2 on each die 110, 120 for each channel 1 to 4 ($CH_1$, $CH_2$, $CH_3$, $CH_4$) on both the transmit side with transmit circuitry shown as Tx, and the receive side with receive circuitry shown as Rx that demonstrates that the transmit and receive circuitry involved in channel crosstalk can be on the same die or on different die. Digital isolator 100 has forward and reverse channels with $CH_1$, $CH_2$, and $CH_3$ being forward channels (those channels with Tx circuitry on die 110), and $CH_4$ being a reverse channel (having Rx circuitry on die 110).

The dies each 110, 120 are shown including optional inductors 135 in each channel for compensation of parasitic capacitance which can cause additional crosstalk between channels across a given die. There are outside bond pads 128 for bonding to leads of a leadframe package, and inside (interior) bond pads 132 for a bondwire 151 coupling the top plate of the HV capacitors C1, C2 from one die to the top plate of the HV capacitors C1, C2 on the other die. The die 110, 120 are shown on a common die pad 160, where the die are secured to the die pad by die attach material 162, such as a metal filled epoxy, which can lead to die-to-die channel crosstalk.

Figure 1B:
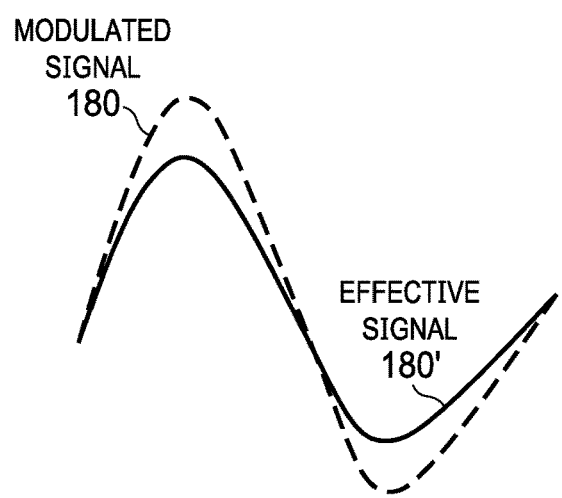
FIG. 1B depicts one cycle of a modulated signal shown as a sinusoid that may be transmitted by transmit circuitry on the digital isolator, and this modulated signal after being distorted by crosstalk noise now shown as an effective signal that may be received at the receiver circuitry due to channel crosstalk.

FIG. 1B depicts one cycle of a modulated signal 180 shown as a sinusoid that may be transmitted by transmit circuitry on the digital isolator 100, and after being distorted by crosstalk noise now shown as an effective signal 180' that may be received at the receive circuitry due to channel crosstalk. The amplitude of the received modulated signal on the receive side will typically be roughly 10% of the transmitted signal amplitude, and the received signal will be delayed by the propagation delay. The modulation can be amplitude modulation.

In one example, the fc1 signal or fc2 signal transmitted by the transmitter across the barrier has an amplitude of 1V p-p, and the receiver receives the transmitted signal as a 100 mV signal after typical signal attenuation (in fc1 or fc2) from the transmitter to the receiver. If it is assumed the signal threshold for the receiver is at 80 mV to detect a bit to enable its successful demodulation, as little as 20 mV of crosstalk noise (across channels) if subtractive can cause bit failures. Signal integrity can be at risk if any kind of noise attenuates the signal received across communication channel resulting in bit miss(es) (i.e. not replicating the pulse pattern at the receiver what is transmitted from transmitter side, see FIG. 4B described below which shows a missing clock pulse). For example, whenever the fc1 signal interacts with the fc2 signal so that say the fc1 on channel 1 is out of phase with fc2 on channel 2, and there is channel crosstalk so that fc1 reaches channel 2 or fc2 reaches channel 1, the effective signal amplitude received by the receiver will be attenuated so that bit errors can occur.

Figure 2A:
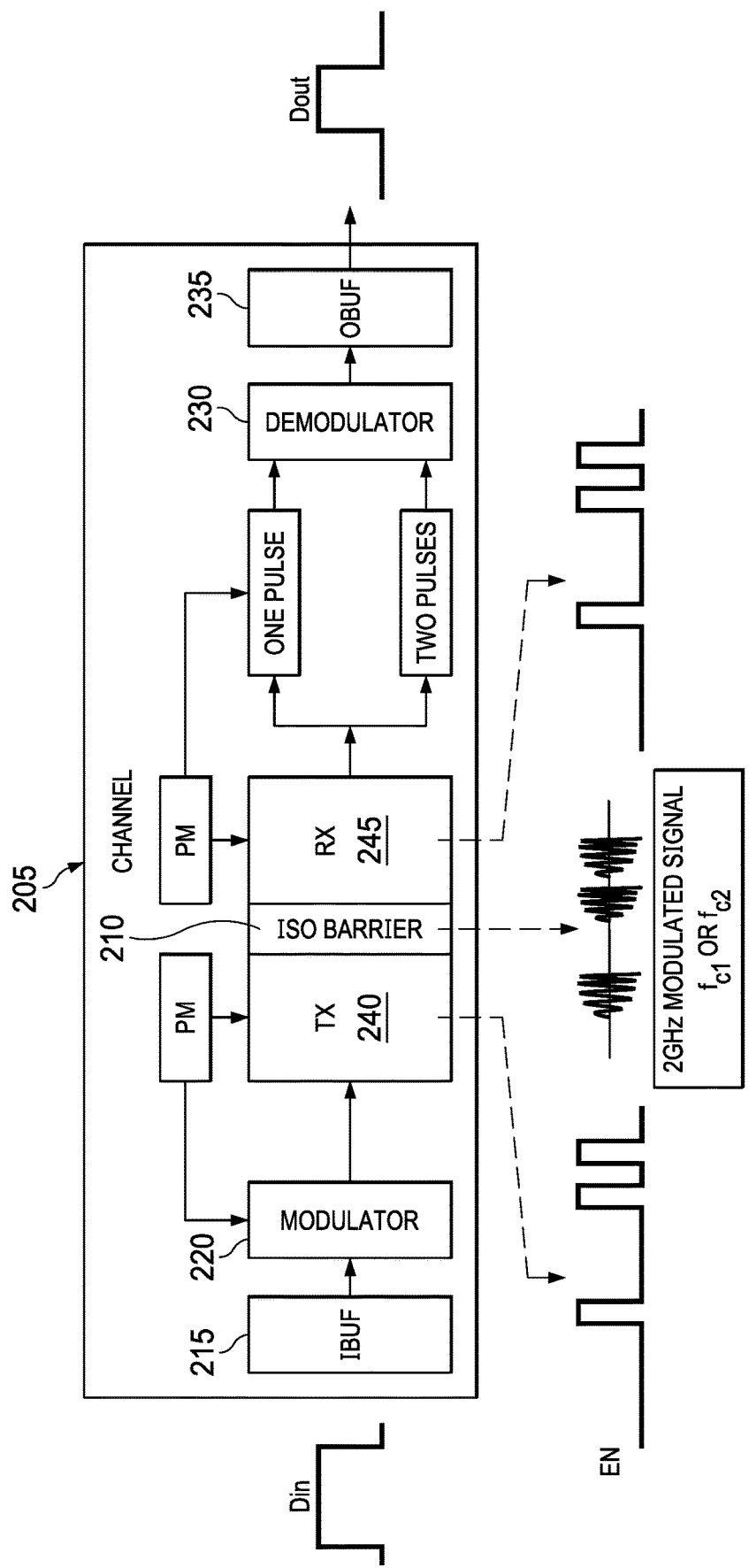
FIG. 2A shows the operation of one channel of a digital isolator having a modulator for modulating a received square wave clock pulse pattern shown as data in (Din) which is the input signal, generating a modulated signal therefrom, and then transmitting the modulated signal across the isolation barrier including HV capacitor(s), which is received by the receive side that has a demodulator which demodulates the modulated signal to try to recover the data in the Din signal shown as data out (Dout).

FIG. 2A shows the operation of one channel 205 of a digital isolator having a modulator 220 on its transmit side for modulating a clock pulse pattern derived from a square wave clock signal (F1 or F2) with data shown as a single pulse Din, and then the transmitter (TX) 240 transmitting the modulated periodic signal (shown as a sinusoid fc1 or fc2) across the isolation barrier 210 including HV capacitor(s). The transmit side of the channel 205 also includes an input buffer (IBUF) 215, while the receive side including a receiver (RX) 245, a demodulator 230, and an output buffer (OBUF) 235. The encoding of data can be based on On-Off Keying (OOK) or based on an edge-based encoding.

The pulse data from Din in this particular example shown is edge encoded by the modulator 220 which generally includes at least one local oscillator with the +ve low to high transition encoded as single (e.g., a 13 ns width) pulse and the −ve (high to low) transition encoded as two (e.g., 13 ns width) pulses with spacing (e.g., 10 ns) in between the two pulses. The local oscillator in the modulator 220 is enabled by the high/low transition from the enable (EN) signal shown, which is generally provided by an ATE for generation of the pulse width modulation signal (shown as a PM signal). The same PM signal is also provided to the demodulator 230 for demodulation. The 2 GHz modulated signal (fc1, fc2) generated by the transmit circuitry is transmitted by the TX 240 across the isolation barrier 210 is received by the RX 245 on the receive side which is then demodulated by the demodulator 230 using the PM signal to try to recover the data in the Din signal shown as Dout.

Figure 2B:
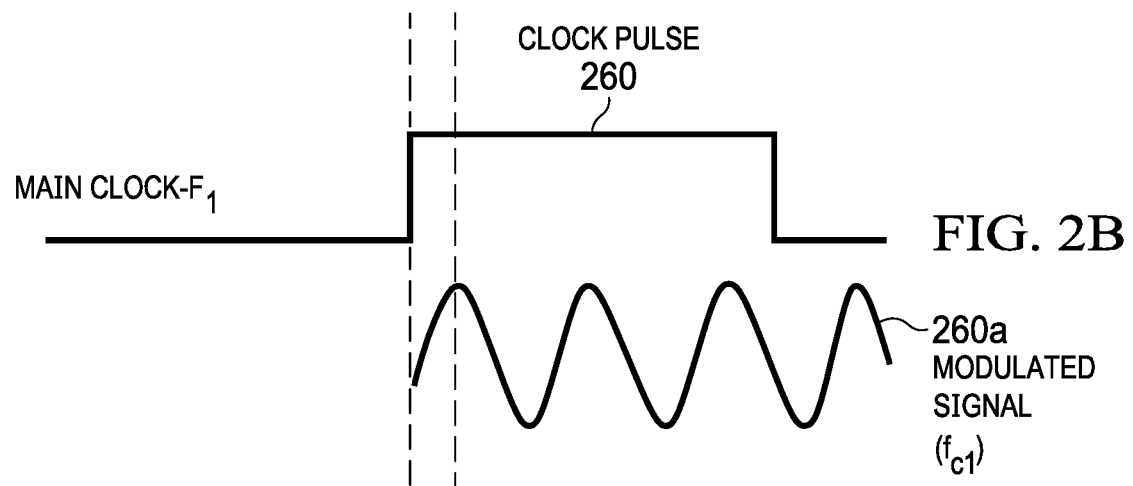
FIG. 2B shows a main clock signal F1 with one clock pulse clock of a clock pulse pattern shown that is processed by a modulator on the transmitter side to provide the modulated signal shown as a sinusoid.
Figure 2C:
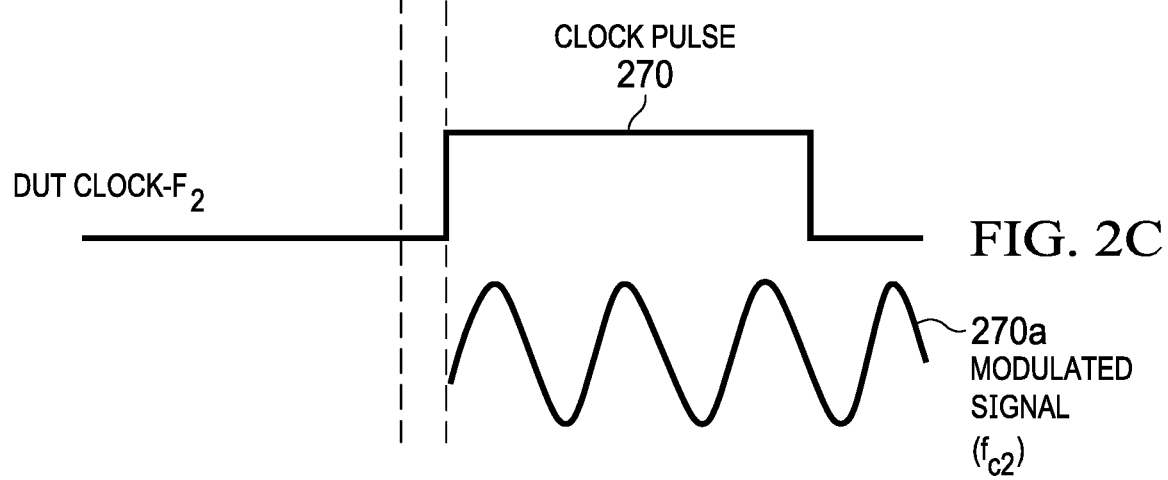
FIG. 2C shows a device under test (DUT) clock signal F2 with one clock pulse of a clock pulse pattern shown that is processed by a modulator on the transmit side to provide the modulated signal shown as a sinusoid. There is a 90° phase difference shown between the respective clock pulses in F1 and F2 and their resulting modulated signals fc1 and fc2.

FIG. 2B shows a main clock signal at F1 with one clock pulse 260 of a clock pulse pattern shown that is processed by a modulator on the transmit side to provide the modulated periodic signal 260a fc1 shown as sinusoid. FIG. 2C shows a DUT clock signal F2 with one clock pulse 270 of a clock pulse pattern that is processed by a modulator on the transmit side to provide the modulated periodic signal 270a fc2 shown as sinusoid. There is a 90° example phase difference shown between the respective clock pulses 260, 270 and their resulting respective modulated periodic signals 260a fc1, and 270a fc2.

Figure 3:
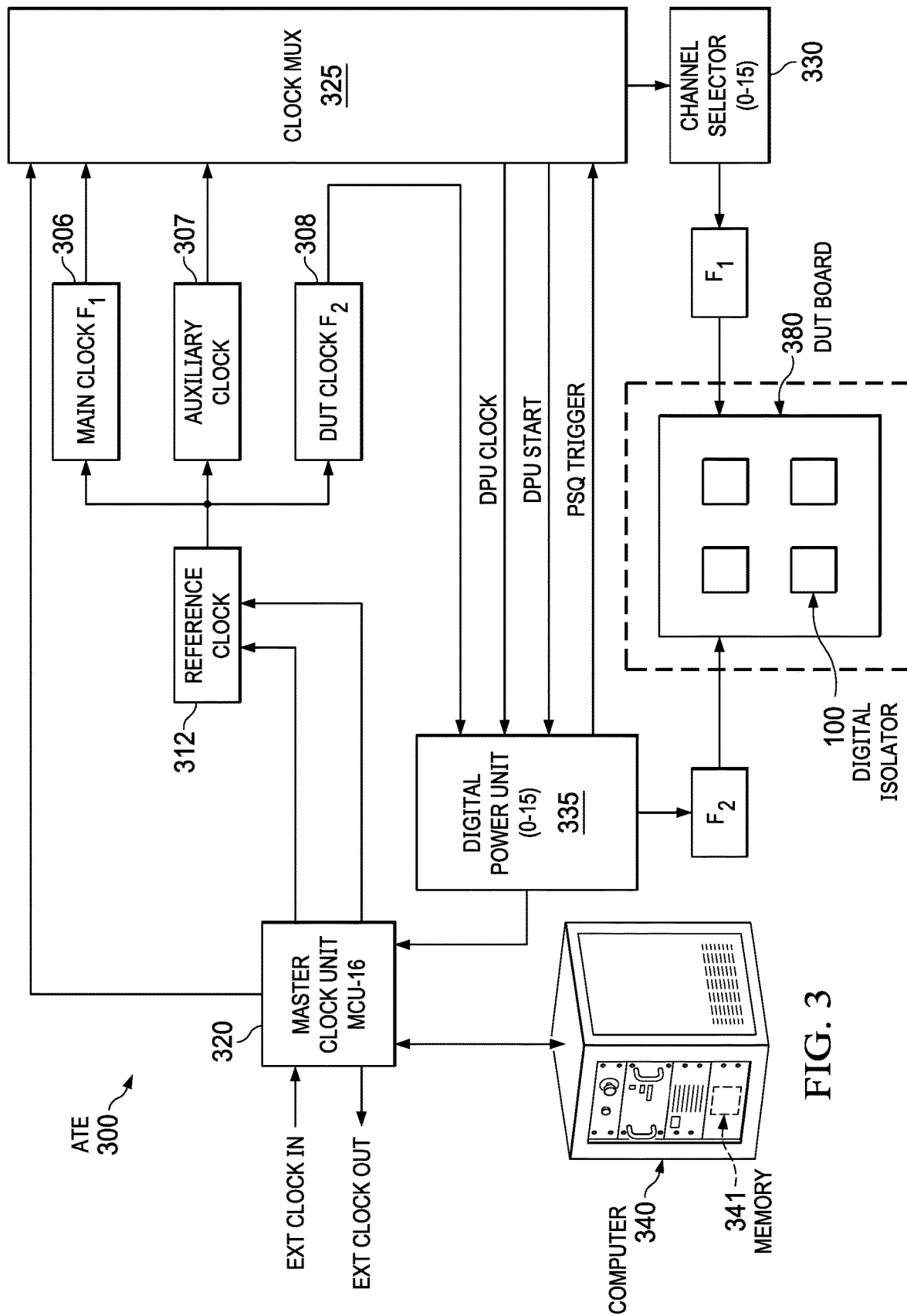
FIG. 3 shows a block diagram depiction of components of an ATE implementing crosstalk pattern generation using its main clock and DUT clock for the crosstalk testing of the digital isolator shown in FIG. 1A, according to an example aspect.

FIG. 3 shows a block diagram depiction of a simplified ATE 300 implementing crosstalk pattern generation using its main clock 306 providing F1 input data pulses in a first clock pulse pattern and the DUT clock 308 provides an F2 input data pulses in a second clock pulse pattern for the crosstalk testing of a plurality of digital isolators 100 shown in FIG. 1A all being on the same DUT board 380, according to an example aspect. ATE 300 also includes an auxiliary clock 307. The DUT board 380 generally has a plurality of packaged digital isolator devices mounted thereon for parallel channel crosstalk testing of the digital isolator DUTs, such as 8 digital isolator devices per DUT board.

As described above, the main clock 306 is synchronous relative to the tester reference clock 312 which is typically a crystal oscillator, while the DUT clock 308 is an asynchronous (or free-running) clock. The modulation signal is generally at least a 1 GHz signal, such as a 2 GHz sinusoidal signal which is generated internally by the digital isolator, such as using an LC oscillator based on the rising or falling edge transitions (see FIG. 2A described above). The ATE 300 generates an input clock pulse pattern from the main clock 306 at F1 and DUT clock 308 at F2 such that F1 and F2 have phase difference between their rising and falling edge transitions.

The main clock 306 providing F1 and the DUT clock 308 providing F2 are set to respective frequencies by a user input (typically by a bit word programmed into a register, and implemented by a direct digital synthesizer DDS)) such that the Greatest Common Divisor (GCD) of time periods of these frequencies (F1, F2) is at least 1% of the period of the main clock 306. To add a desired phase delay between F1 and F2 and thus between fc1 and fc2, see the cross talk pattern generation described in the Examples below. With F1 and F2 generated such that the GCD between time periods of F1 and F2 is around 1% of the longer of the two clock periods and the crosstalk test is run for a considerable time, at least 100 k cycles, such as about 600 k cycles, essentially all the possible phase shift combinations between the rising or falling edge of these two clocks gets covered including the worst case phase difference of 180 degrees.

Firmware for implementing disclosed channel crosstalk testing may be stored in the memory 341 of the computer 340 that includes a processor such as a digital signal processor (DSP), a microcontroller, an application specific integrated circuit (ASIC), a general processor, or any other combination of one or more integrated processing devices. The computer 340 is coupled to control the master clock unit 320 shown as MCU-16 which provides an external clock reference for the reference clock 312, where the reference clock 312 is coupled to the main clock 306, the auxiliary clock 307, and the DUT clock 308.

The ATE 300 is shown including a clock multiplexer (MUX) 325 which receives a first clock pulse pattern including first clock pulses from the main clock (F1), where the clock MUX 325 is coupled to a channel selector 330, which outputs a first clock pulse pattern to the DUT board 380. The clock MUX 325 is also coupled to a digital power unit 335 that receives a digital power unit (DPU) clock and DPU start signal from the clock MUX 325, and outputs the second clock pulse pattern including second clock pulses from the DUT clock (F2) to the DUT board 380.

In FIG. 3 the master clock unit 320 controls three independent programmable clock sources. The main clock 306 and the auxiliary clock 307 may both be programmable from 25 to 66 MHz, while the DUT clock 308 may be programmable from 1 Hz to 66 MHz. An external (Ex) clock input, shown as Ex clock IN from either on the DUT board 380 or at the ATE 300, can also be selected to clock the master clock unit 320. In order for the master clock unit 320 utilities to work properly, as described above, a user generally programs the frequency of the clock sources.

Figure 4A:
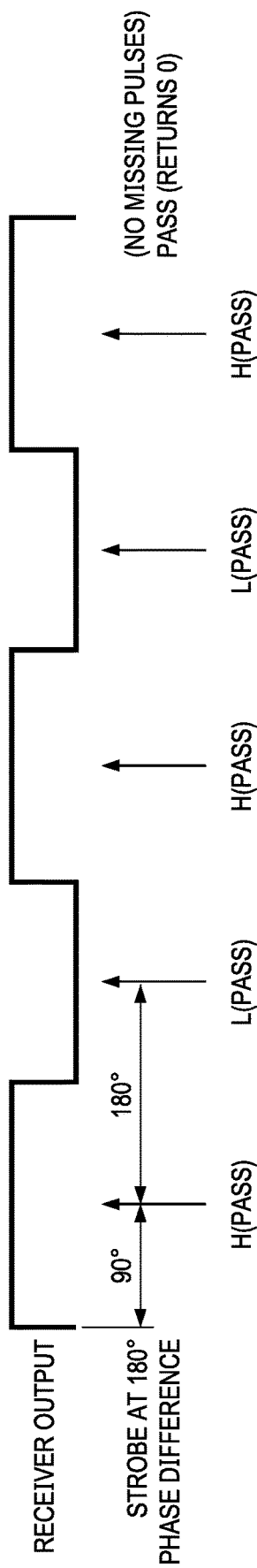
FIG. 4A depicts results from strobing the output clock pulses of the first or second clock pulse pattern when compared to the input clock pulse pattern generated from F1 or F2. Strobing is shown at every 180° phase interval starting at a 90° phase. The vector pattern configuration comparing returns a 0 for a pass (indicating no missing clock pulses) and returns a 1 for failure (indicating a missing clock pulse).

FIG. 4A depicts results from strobing the output clock pulses of the first or second clock pulse when compared to the input clock pulse pattern generated from F1 or F2. The receiver output is the transmitted input clock pulse shifted by the inherent propagation delay of the digital isolator. Strobing is shown at every 180° phase interval starting at a 90° phase. The vector pattern configuration comparing process returns a 0 for a pass (indicating no missing clock pulses) and returns a 1 for failure (indicating at least one missing clock pulse). FIG. 4A has no missing clock pulses shown, so the channel crosstalk test is passed.

Figure 4B:
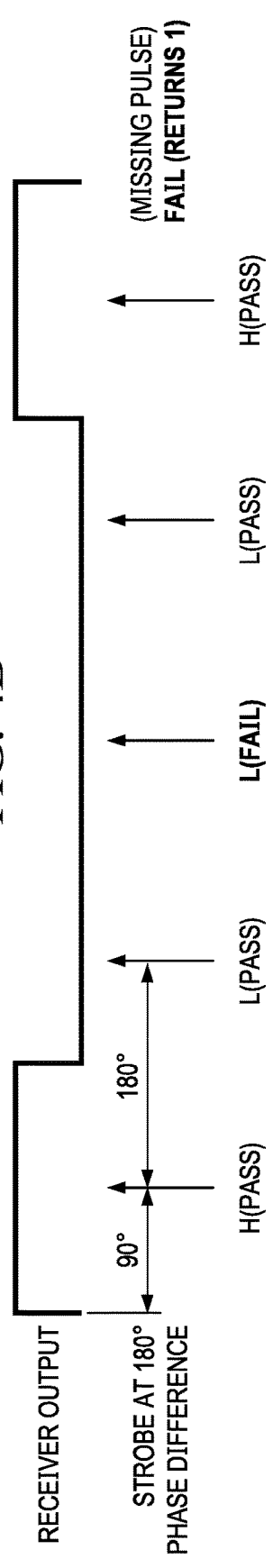
FIG. 4B represents results from strobing the output clock pulses of the first or second clock pulse pattern when compared to the input clock pulse pattern generated from F1 or from F2, where in this case there is a missing clock pulse so that the crosstalk test is failed.

FIG. 4B represents results from strobing the output clock pulse of the first or second clock pulse pattern when compared to the input clock pulse pattern (derived from F1 or from F2). In this case there is a missing clock pulse so that the digital isolator fails the channel crosstalk test.

EXAMPLES

Disclosed aspects are further illustrated by the following specific Examples, which should not be construed as limiting the scope or content of this Disclosure in any way.

Assume F1 from the main clock 306 of the ATE 300 is at 2 MHz configured as a first clock pulse pattern input to the digital isolator with its modulation using a 2 GHz carrier. F1 thus has a 500 nsec cycle time which corresponds to 2 MHz as frequency=1/pulse cycle time. F2 may be set at 1.986 MHz=a 503.545 nsec cycle time. Thus, the GCD between time periods of F1 and F2 is thus 5 psec. This method thus introduces and utilizes a phase shift between F1 and F2 (e.g., both at essentially 2 MHz signals) which are controlled inputs that produce a desired phase shift in fc1 and fc2 (e.g., both 2 GHz signals) that are internally generated on the digital isolator.

If the above-described clocks F1 and F2 are run for longer time, for example for 600 k cycles (based on the worst case from a design simulation and statistical calculation) or 300 msec for a 2 MHz main clock 306 and 1.986 MHz DUT clock 308 based on a statistical calculation and design simulation, for 120 instances the phase shift or the edge placement (falling edge or a rising edge) between F1 and F2 will be in a range of 1 psec to 100 psec with 12 edge placements each in each of the 10 psec bins from 1 psec to 100 psec. Random jitter on both of the clocks eventually helps to add some phase shift on top of the existing one, which shifts the edge placement bins, and ensures the phase difference between two clocks (F1 and F2) falls in the range from 1 psec to 100 psec.

Those skilled in the art to which this Disclosure relates will appreciate that many other variations are possible within the scope of the claimed invention, and further additions, deletions, substitutions and modifications may be made to the described aspects without departing from the scope of this Disclosure.

The invention claimed is:

1. A method of making a digital isolator, comprising:
attaching a first semiconductor die to a die pad, the first die including a modulator, a transmitter and a capacitive barrier for each channel of the transmitter;
attaching a second semiconductor die to the die pad, the second die including a demodulator, a receiver and a capacitive barrier for each channel of the receiver;
coupling each capacitive barrier on the first semiconductor die to a respective capacitive barrier on the second semiconductor die with a bond wire;
configuring a first clock signal at a first frequency ($F_i$) with a first clock period in a first clock pulse pattern and a second clock signal with a second clock period at a different second frequency ($F_2$) in a second clock pulse pattern, wherein clock pulses in the first clock pulse pattern and the second clock pulse pattern have a phase difference,
the transmitter of a first channel encoding the first clock pulse pattern then modulating with a first carrier frequency to provide a fc1 signal and the transmitter of a second channel encoding the second clock pulse pattern then modulating with a second carrier frequency to provide a fc2 signal;
the receiver of the first channel demodulating the fc1 signal received during a rising or a falling edge of the $F_1$ to generate a delayed received version of the first clock pulse pattern and the receiver of the second channel demodulating the fc2 signal received during a rising or a falling edge of the $F_2$ to generate a delayed received version of the second clock pulse pattern, and
identifying for missing pulses by comparing the delayed received version of the first clock pulse pattern to the first clock pulse pattern and the delayed received version of the second clock pulse pattern to the second clock pulse pattern.

2. The method of claim 1, wherein the fc1 signal and the fc2 signal are both sinusoids.

3. The method of claim 1, wherein the phase difference comprises a minimum of at least 1% of a shortest clock period of the first clock period and the second clock period.

4. The method of claim 1, wherein the identifying comprises strobing during each ON and OFF interval of the delayed received version of the first clock pulse pattern and the delayed received version of the second clock pulse pattern.

5. The method of claim 4, wherein the strobing is performed at every 180° phase interval and begins at a 90° phase.

6. The method of claim 1, wherein the first clock pulse pattern is provided by a synchronous main clock relative to a reference clock on automated test equipment (ATE), and wherein the second clock pulse pattern is provided by free running clock on the ATE.

7. The method of claim 1, wherein the first clock pulse pattern and the second clock pulse pattern encode data based on-and-off keying (OOK) or an edge-based architecture.

8. The method of claim 1, wherein the first carrier frequency and the second carrier frequency are both >1 GHz.

9. The method of claim 1, wherein the first clock pulse pattern and the second clock pulse pattern both include at least 100,000 duty cycles.

10. The method of claim 1, wherein the identifying comprises identifying intra die crosstalk failures across the first or the second channels both on the first die or both on the second die.

11. The method of claim 1, wherein the identifying comprises identifying inter die crosstalk failures across the first or the second channels involving the first die and the second die.

12. The method of claim 1, wherein each capacitive barrier comprises two capacitors.

13. The method of claim 1, wherein the transmitter is a 4 channel transmitter.

14. The method of claim 13 where 3 of the 4 channels are forward channels and 1 channel is a reverse channel.

15. The method of claim 1, wherein the receiver is a 4 channel receiver.

16. The method of claim 15 where 3 of the 4 channels are forward channels and 1 channel is a reverse channel.

17. The method of claim 1, wherein each die includes an inductor in each channel for compensation of parasitic capacitance.

18. The method of claim 1, further including bond pads on each die for bonding to leads of a leadframe package.

19. The method of claim 1, further including bond pads for the bond wire coupling a top plate of the capacitive barrier on the transmitter die to a top place of the capacitive barrier on the receiver die.

20. Automated test equipment (ATE) for crosstalk testing of a multi-channel digital isolator, the ATE comprising:
pattern generation and detection code stored in firmware in a memory associated with a computer of the ATE, the firmware implementing a method of detecting crosstalk for a digital isolator having a first channel and at least a second channel comprising a first die and at least a second die with each the channel include a transmit side including a modulator and a transmitter and a receive side including a receiver and a demodulator coupled by a bond wire, wherein at least one of the first and the second die include a barrier comprising a high voltage (HV) capacitor for each the first and the second channel, the method comprising:

the ATE configuring a first clock signal at a first frequency ($F_1$) with a first clock period in a first clock pulse pattern and a second clock signal with a second clock period at a different second frequency ($F_2$) in a second clock pulse pattern, wherein the clock pulses in the first clock pulse pattern and the second clock pulse pattern have a phase difference, wherein the transmitter of the first channel encodes the first clock pulse pattern then modulating with a first carrier frequency to provide a fc1 signal and the transmitter of the second channel encoding the second clock pulse pattern then modulating with a second carrier frequency to provide a fc2 signal;

wherein the receiver of the first channel demodulates the fc1 signal received during a rising or a falling edge of the $F_1$ to generate a delayed received version of the first clock pulse pattern and the receiver of the second channel demodulates the fc2 signal received during a rising or a falling edge of the $F_2$ to generate a delayed received version of the second clock pulse pattern, and the ATE identifying for missing pulses by comparing the delayed received version of the first clock pulse pattern to the first clock pulse pattern and the delayed received version of the second clock pulse pattern to the second clock pulse pattern.

21. The ATE of claim 20, wherein the phase difference comprises a minimum of at least 1% of a shortest clock period of the first clock period and the second clock period.

22. The ATE of claim 20, wherein the identifying comprises strobing during each ON and OFF interval of the delayed received version of the first clock pulse pattern and the delayed received version of the second clock pulse pattern.

23. The ATE of claim 22, wherein the strobing is performed at every 180° phase interval and begins at a 90° phase.

24. The ATE of claim 20, wherein the first clock pulse pattern is provided by a synchronous main clock relative to a reference clock on the ATE, and wherein the second clock pulse pattern is provided by free running clock on the ATE.

25. The ATE of claim 20, wherein the first clock pulse pattern and the second clock pulse pattern encode data based on-and-off keying (OOK) or an edge-based architecture.

26. The ATE of claim 20, wherein the first clock pulse pattern and the second clock pulse pattern both include at least 100,000 duty cycles.

27. The ATE of claim 20, wherein the identifying comprises strobing during each ON and OFF interval of the delayed received version of the first clock pulse pattern and the delayed received version of the second clock pulse pattern.

28. The ATE of claim 27, wherein the phase difference comprises a minimum of at least 1% of a shortest clock period of the first clock period and the second clock period.

* * * * *